United States Patent
Song

(10) Patent No.: US 12,198,750 B2
(45) Date of Patent: Jan. 14, 2025

(54) CONTROL METHOD AND SYSTEM IN 3D NAND SYSTEMS

(71) Applicant: Yangtze Memory Technologies Co., Ltd., Hubei (CN)

(72) Inventor: Daesik Song, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 123 days.

(21) Appl. No.: 18/052,777

(22) Filed: Nov. 4, 2022

(65) Prior Publication Data
US 2024/0153547 A1    May 9, 2024

(51) Int. Cl.
*G11C 11/408* (2006.01)
*G11C 11/4096* (2006.01)
*G11C 16/08* (2006.01)

(52) U.S. Cl.
CPC ...... *G11C 11/4087* (2013.01); *G11C 11/4085* (2013.01); *G11C 11/4096* (2013.01); *G11C 16/08* (2013.01)

(58) Field of Classification Search
CPC .......... G11C 11/4087; G11C 11/4085; G11C 11/4096; G11C 16/08
See application file for complete search history.

(56) References Cited

U.S. PATENT DOCUMENTS

| | | | | |
|---|---|---|---|---|
| 6,457,093 B2 * | 9/2002 | Roohparvar | ........... | G11C 16/20 365/191 |
| 7,447,847 B2 * | 11/2008 | Louie | ............... | G11C 29/028 365/185.22 |
| 7,688,632 B2 * | 3/2010 | Nagashima | ........... | G11C 16/12 365/185.11 |
| 8,238,160 B2 * | 8/2012 | Kim | ............... | G11C 11/5642 365/185.23 |
| 9,548,124 B1 * | 1/2017 | Hazeghi | ............... | G11C 7/14 |
| 9,595,309 B2 * | 3/2017 | Kim | ............... | G11C 8/08 |

* cited by examiner

*Primary Examiner* — Son L Mai
(74) *Attorney, Agent, or Firm* — Hanley, Flight & Zimmerman, LLC

(57) ABSTRACT

The present disclosure provides a three-dimensional NAND memory device, comprising memory cells coupled to a plurality of word lines and configured to store data, a row decoder configured to decode an address of a word line from the plurality of word lines, and a controller coupled to the array of memory cells. The controller includes a first multiplexer configured to receive a first plurality of trim selections, while each of the first plurality of trim selections is associated with a first trim parameter and each of the first plurality of trim selections corresponds to each of the plurality of word lines, respectively. The controller also includes a second multiplexer configured to receive a first plurality of trim settings, while each of the first plurality of trim settings corresponds to a value associated with the first trim parameter.

20 Claims, 11 Drawing Sheets

CONTROL METHOD AND SYSTEM IN 3D NAND SYSTEMS

TECHNICAL FIELD

This description generally relates to the field of semiconductor technology, and more particularly, to a control method and system in 3D NAND memory.

BACKGROUND

A memory device, such as a flash memory chip, can program a memory cell of the memory device by applying a voltage, such as a programming voltage, to the memory cell to perform a programming operation. In some aspects, memory cells in a same memory bock of the memory device can share the same word line (WL) and can be programmed simultaneously. One or more trim settings can be selected to adjust one or more trim parameters such as voltage levels and/or signal timings associated with one or more WLs in a memory block during programming operations.

BRIEF SUMMARY

Some aspects of this disclosure relate to memory devices for performing trim settings selections.

Some aspects of this disclosure relate to a three-dimensional (3D) NAND memory device. A 3D NAND memory device includes memory cells coupled to a plurality of word lines. In some aspects, the memory cells can be configured to store data. The 3D NAND memory device also includes a row decoder configured to decode an address of a word line from the plurality of word lines. The 3D NAND memory device further includes a controller coupled to the array of memory cells. The controller includes a first multiplexer configured to receive a first plurality of trim selections. In some aspects, each of the first plurality of trim selections is associated with a first trim parameter and each of the first plurality of trim selections corresponds to each of the plurality of word lines, respectively. The first multiplexer is also configured to select a first trim selection corresponding to the word line from the first plurality of trim selections. The first multiplexer is further configured to output the first trim selection to a first trim selection decoder. The controller includes a second multiplexer configured to receive a first plurality of trim settings. In some aspects, each of the first plurality of trim settings corresponds to a value associated with the first trim parameter. The second multiplexer is also configured to select a first trim setting from the first plurality of trim settings. In some aspects, the first trim setting is associated with the first trim parameter and corresponds to the word line. The second multiplexer is further configured to output the first trim setting to the row decoder.

According to some aspects, the first trim parameter can include a voltage level control trim parameter or a timing control trim parameter to perform a programming operation on the word line.

According to some aspects, the first trim setting can include a programming signal magnitude, a read reference signal magnitude, or a pass signal magnitude to perform a programming operation on the word line.

According to some aspects, the first trim setting can include a programming signal length, or a read reference signal length to perform a programming operation on the word line.

According to some aspects, the number of the first plurality of trim settings can include four.

According to some aspects, the controller can be configured to control the row decoder to apply the first trim setting to the word line for performing a programming operation on the word line.

According to some aspects, the controller can further include a third multiplexer configured to receive a second plurality of trim selections. In some aspects, each of the second plurality of trim selections can be associated with a second trim parameter and each of the second plurality of trim selections corresponds to each of the plurality of word lines respectively. The third multiplexer can be also configured to select a second trim selection corresponding to the word line from the second plurality of trim selections. The third multiplexer can be further configured to output the second trim selection to a second trim selection decoder.

According to some aspects, the controller can further include a fourth multiplexer configured to receive a second plurality of trim settings. In some aspects, each of the second plurality of trim settings corresponds to a value associated with the second trim parameter. The fourth multiplexer can be configured to select a second trim setting from the second plurality of trim settings. In some aspects, the second trim setting is associated with the second trim parameter and corresponds to the word line. The fourth multiplexer can also be configured to output the second trim setting to the row decoder.

According to some aspects, the second trim parameter can include a voltage level control trim parameter or a timing control trim parameter to perform a programming operation on the word line.

According to some aspects, the number of the second plurality of trim settings can include four.

According to some aspects, the controller can be configured to control the row decoder to apply the second trim setting to the word line to perform a programming operation on the word line.

According to some aspects, the second trim parameter can be different from the first trim parameter.

Some aspects of this disclosure relate to a method for operating a memory device. The method for operation the memory device includes receiving a first plurality of trim selections. The method also includes selecting a first trim selection corresponding to a word line from the first plurality of trim selections. The method also includes outputting the first trim selection to a first trim selection decoder. The method also includes receiving a first plurality of trim settings. Each of the first plurality of trim settings corresponds to a value associated with a first trim parameter. The method also includes selecting a first trim setting from the first plurality of trim settings based on an output of the first trim selection decoder. The first trim setting is associated with the first trim parameter and corresponds to the word line. The method further includes outputting the first trim setting.

According to some aspects, the first trim parameter can include a voltage level control trim parameter or a timing control trim parameter to perform a programming operation on the word line.

According to some aspects, the first trim setting can include a programming signal magnitude, a read reference signal magnitude, or a pass signal magnitude to perform a programming operation on the word line.

According to some aspects, the first trim setting can include a programming signal length, or a read reference signal length to perform a programming operation on the word line.

According to some aspects, the number of the first plurality of trim settings can include four.

According to some aspects, the method for operation the memory device can include applying the first trim setting to the word line for performing a programming operation on the word line.

According to some aspects, the method for operation the memory device can include receiving a second plurality of trim selections. The method for operation the memory device can also include selecting a second trim selection corresponding to the word line from the second plurality of trim selections. The method for operation the memory device can also include outputting the second trim selection to a second trim selection decoder. The method for operation the memory device can also include receiving a second plurality of trim settings. Each of the second plurality of trim settings can correspond to a value associated with a second trim parameter. The method for operation the memory device can also include selecting a second trim setting from the second plurality of trim settings based on an output of the second trim selection decoder. The second trim setting can be associated with the second trim parameter and corresponds to the word line. The method for operation the memory device can further include outputting the second trim setting.

According to some aspects, the second trim parameter can be different from the first trim parameter.

Some aspects of this disclosure relate to a memory system. A memory system includes a memory array comprising memory cells coupled to a plurality of word lines. In some aspects, the memory cells can be configured to store data. The memory system also includes a row decoder configured to decode an address of a word line from the plurality of word lines. The memory system further includes a controller coupled to the array of memory cells. The controller includes a first multiplexer configured to receive a first plurality of trim selections. In some aspects, each of the first plurality of trim selections is associated with a first trim parameter and each of the first plurality of trim selections corresponds to each of the plurality of word lines, respectively. The first multiplexer is also configured to select a first trim selection corresponding to the word line from the first plurality of trim selections. The first multiplexer is further configured to output the first trim selection to a first trim selection decoder. The controller includes a second multiplexer configured to receive a first plurality of trim settings. In some aspects, each of the first plurality of trim settings corresponds to a value associated with the first trim parameter. The second multiplexer is also configured to select a first trim setting from the first plurality of trim settings. In some aspects, the first trim setting is associated with the first trim parameter and corresponds to the word line. The second multiplexer is further configured to output the first trim setting to the row decoder.

This Summary is provided merely for purposes of illustrating some aspects to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the present disclosure and, together with the description, further serve to explain the principles of the disclosure and enable a person of skill in the relevant art(s) to make and use the disclosure.

Figure 1:
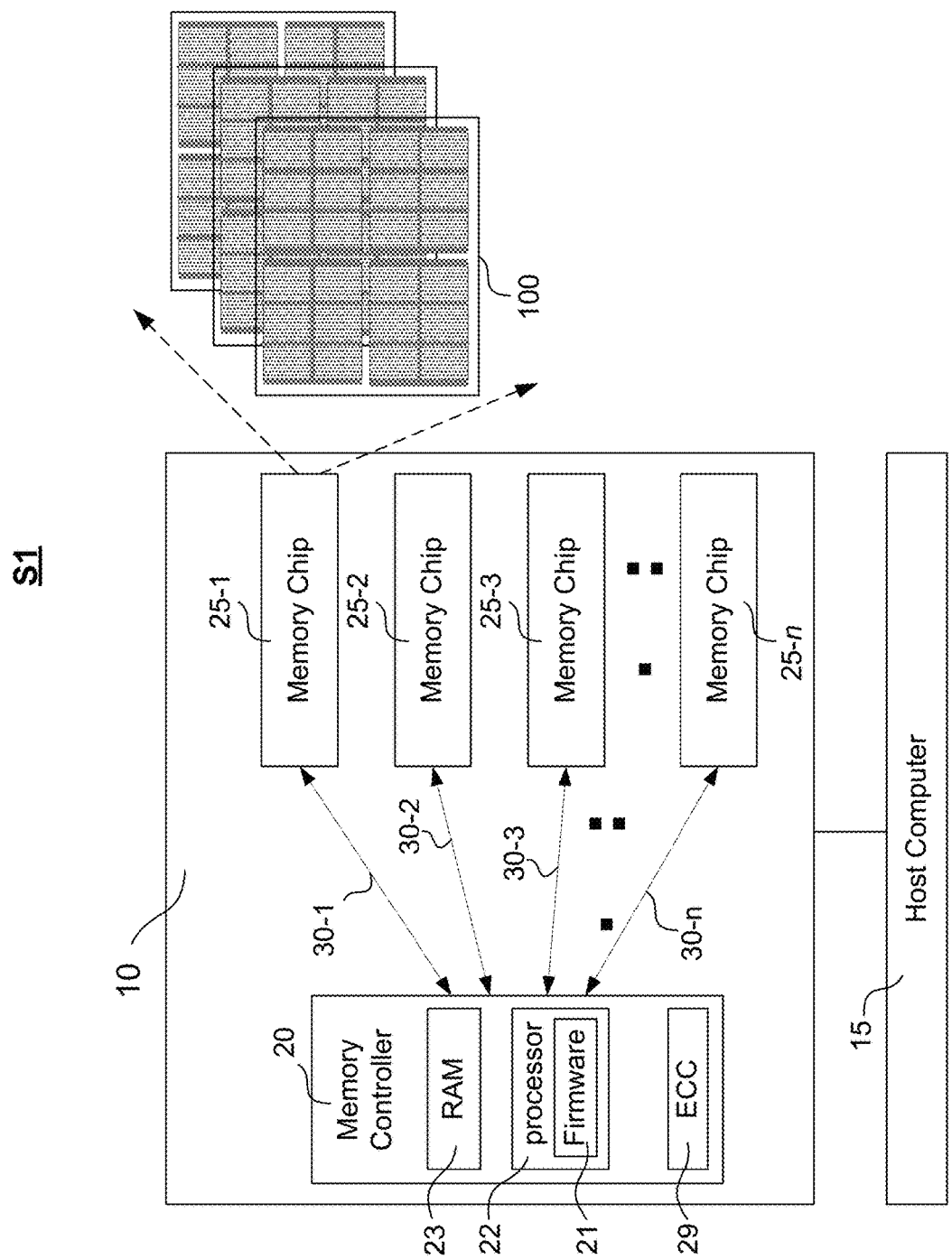
FIGS. 1 and 2A-2B illustrate a storage system with one or more memory chips, according to some embodiments.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

A memory device, such as a flash memory chip, can program a memory cell of the memory device by applying a voltage, such as a programming voltage, to the memory cell to perform a programming operation. In some aspects, memory cells in a same memory bock of the memory device can share the same word line (WL) and can be programmed simultaneously.

One or more trim settings can be selected to adjust one or more trim parameters such as voltage levels and/or signal timings associated with either all of the WLs or a group of WLs in a memory block during programming operations. Due to different physical locations of each of the memory cells, the electrical performance may be different. Hence, the optimum voltage level and/or timing control of WL signals during programming operations can be different.

Currently, it may not be flexible to control one or more trim parameters associated with a few WLs that show different performance compared to other WLs due to process variation or design, based on different physical locations in the memory block. For example, one or more timing trim parameters may need to be relaxed to accommodate slower rising time and falling time associated with high resistance WL during programming operations. In current implementations of trim parameter control, the relaxed timing trim parameter for the high resistance WL may affect timing for one or more lower resistance WLs as well. This may cause unnecessary performance degradation for lower resistance WLs.

FIG. 1 illustrates a block diagram of an electronic device S1 having a storage system 10, according to some embodiments. In some embodiments, the electronic device S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Storage system 10 (e.g., a NAND storage system) can include a memory controller 20 and one or more semiconductor memory chips 25-1, 25-2, 25-3, ..., 25-n. Each semiconductor memory chip 25 (hereafter just "memory chip") can be a NAND chip (e.g., "flash," "NAND flash" or "NAND"). Storage system 10 can communicate with a host computer 15 through memory controller 20, where memory controller 20 can be connected to one or more memory chips 25-1, 25-2, 25-3, ..., 25-n, via one or more memory channels 30-1, 30-2, 30-3, ..., 30-n. In some embodiments, each memory chip 25 can be managed by memory controller 20 via one or more memory channels 30-1, 30-2, 30-3, ..., 30-n.

In some embodiments, host computer 15 can include a processor of an electronic device, such as a central processing unit (CPU), or a system-on-chip (SoC), such as an application processor (AP). Host computer 15 can send data to be stored at storage system 10 and/or can retrieve data from stored in storage system 10.

In some embodiments, memory controller 20 can handle I/O requests received from host computer 15, ensure data integrity and efficient storage, and manage memory chip 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

In some embodiments, the memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2B:
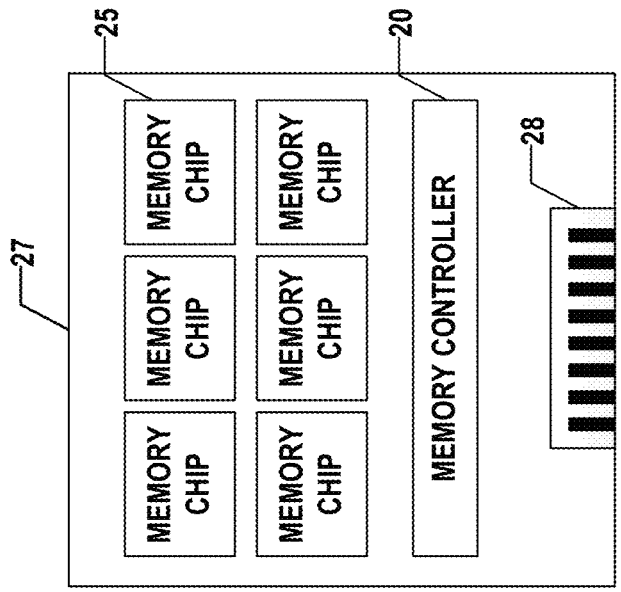
Figure 2A:
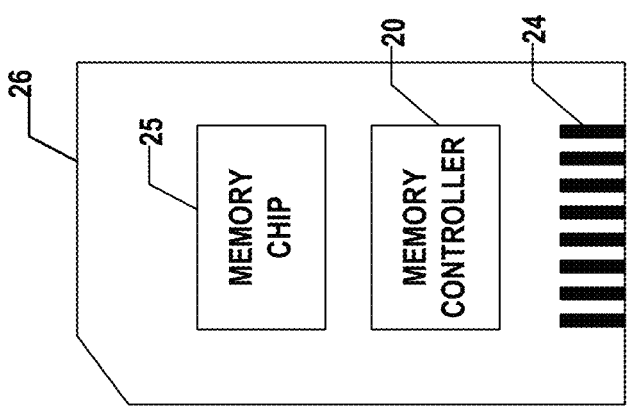

In some embodiments, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory chip 25 can be integrated into a solid state drive (SSD) 27. SSD 27 can further include a SSD connector 28 coupling SSD 27 with a host (e.g., the host computer 15 in FIG. 1).

Figure 3:
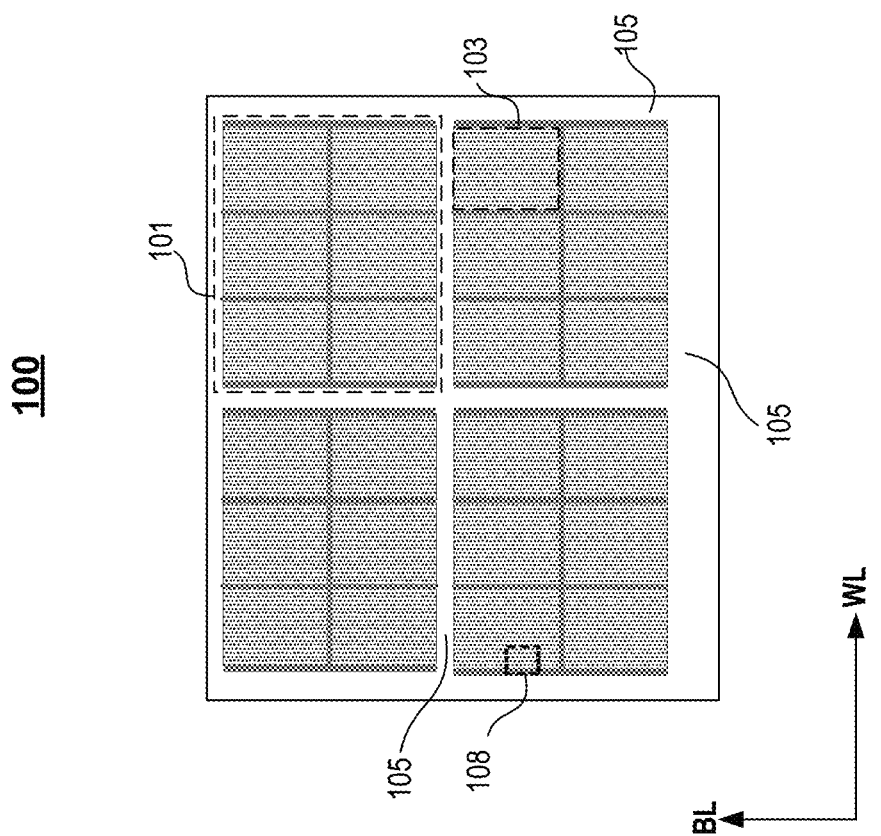
FIG. 3 illustrates a schematic diagram of a memory die, according to some embodiments.

FIG. 3 illustrates a top-down view of a memory die 100, according to some embodiments. The example configuration shown in FIG. 3 is given as a non-limiting example and it is to be appreciated that memory is scalable. In some embodiments, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

In some embodiments, memory die 100 can also include a periphery region 105, an area surrounding memory planes 101. The periphery region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
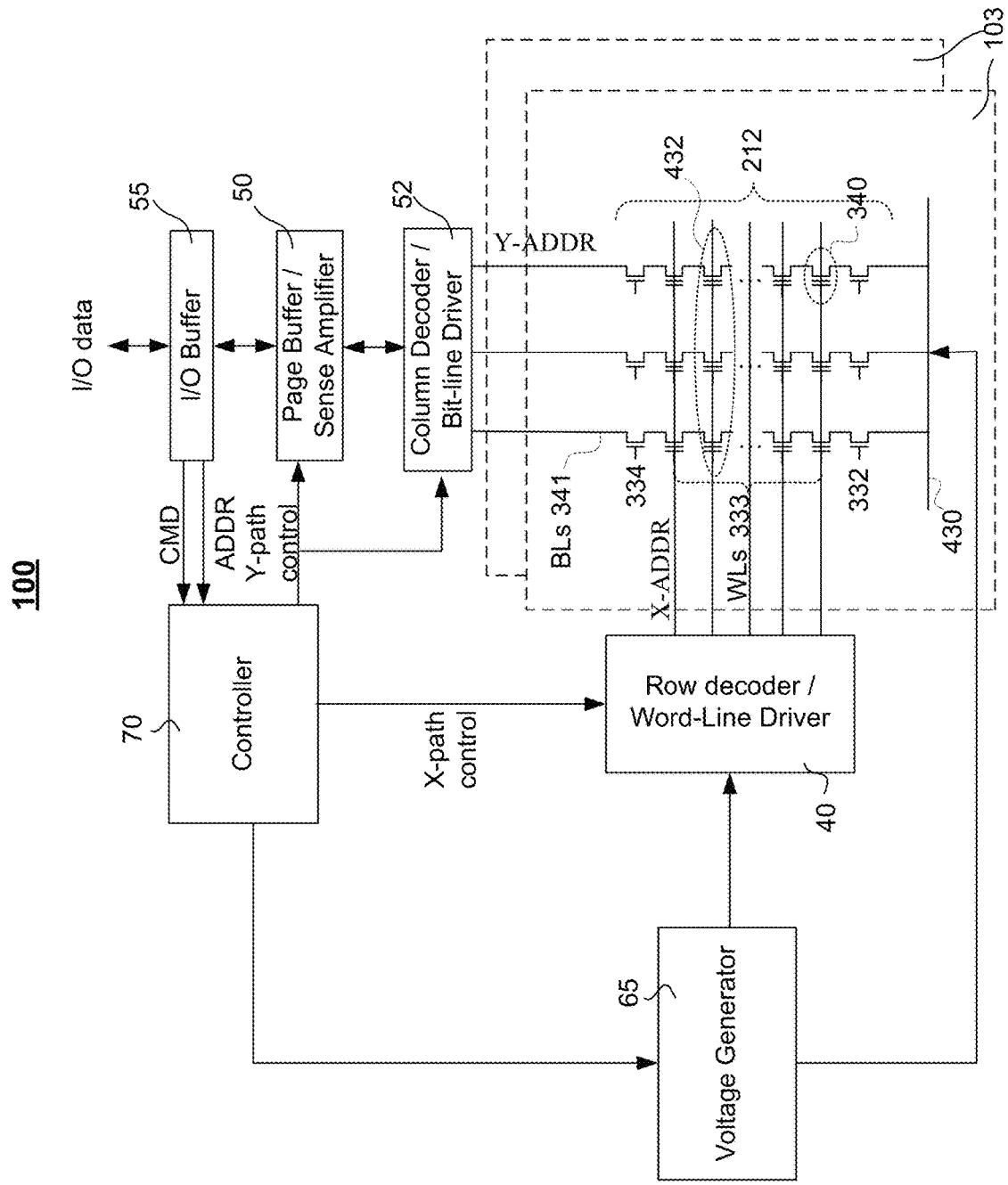
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a controller 70, a voltage generator 65 and an input/output buffer 55. Controller 70 can include one or more control circuits. In some aspects, controller 70 can include one or more registers, buffers, and/or memories to store one or more trim settings as described in the present disclosure. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to an X-path control signal provided by the controller 70. Row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the controller 70.

In some embodiments, column decoder/bit line driver 52 can transfer an inhibit voltage $V_{inhibit}$ to an unselected bit line and connect a selected bit line to ground according to a Y-path control signal received from controller 70. In the other words, column decoder/bit line driver 52 can be configured to select or unselect one or more memory strings 212 according to the Y-path control signal from controller 70. The page buffer/sense amplifier 50 can be configured to read and program (write) data from and to the memory block 103 according to the control signal Y-path control from the controller 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some embodiments, in order to increase the efficiency of a write operation, column decoder/bit line driver 52 can transfer a bias voltage Vbias to a selected bit line according to a Y-path control signal from controller 70 and the data to be programmed from page buffer/sense amplifier 50.

In some embodiments, input/output buffer 55 can transfer the I/O data from/to the page buffer/sense amplifier 50 as well as addresses ADDR or commands CMD to the controller 70. In some embodiments, input/output buffer 55 can function as an interface between memory controller 20 (in FIG. 1) and memory die 100 on memory chip 25.

In some embodiments, controller 70 can control page buffer/sense amplifier 50 and row decoder/word line driver 40 in response to the commands CMD transferred by the input/output buffer 55. During the program operation, controller 70 can control row decoder/word line driver 40 and page buffer/sense amplifier 50 to program a selected memory cell. During the read operation, controller 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of controller 70. The voltages generated by voltage generator 65 include the read voltage $V_{read}$, the program voltage $V_{pgm}$, the pass voltage $V_{pass}$, the inhibit voltage $V_{inhibit}$, the bit line bias voltage Vbias, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., controller 70, I/O buffer 55) on memory die 100 shown in FIG. 4 can also be moved off memory die 100, as a stand-alone electric component in the storage system 10. Components (e.g., controller 70, I/O buffer 55) on memory die 100 shown in FIG. 4 can also be moved to other components in storage system 10, for example, a portion of controller 70 can be combined with memory controller 20 and vice versa.

Figure 5:
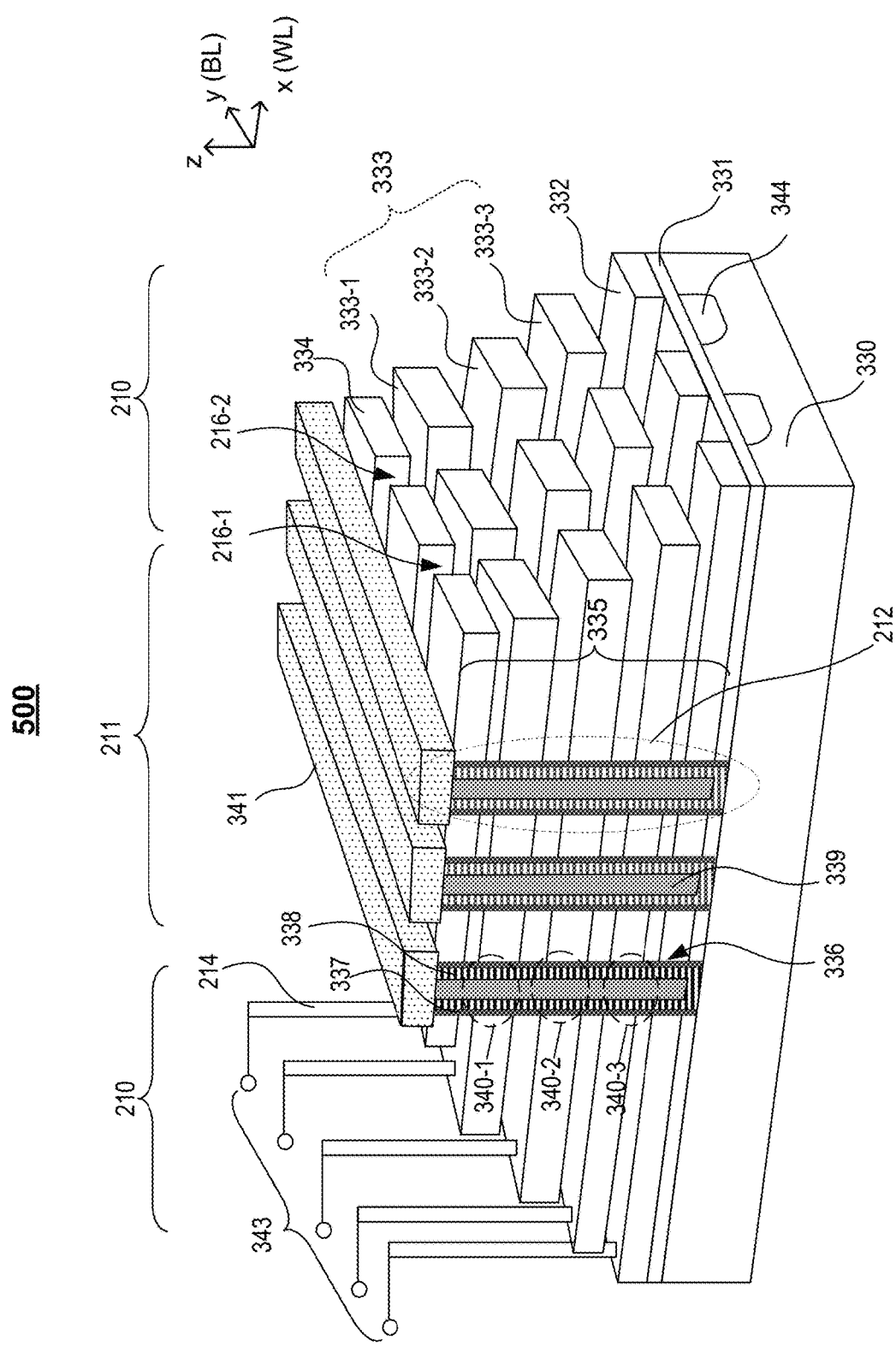
FIG. 5 illustrates a perspective view of a portion of a 3D memory structure, according to some embodiments.

FIG. 5 illustrates a perspective view of a 3D memory structure 500, according to some embodiments. In some embodiments, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage $V_{th}$ of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage $V_{th}$ of the memory cell. During a read operation, a read voltage $V_{read}$ can be applied on control gate 333 of the memory cell and current flowing through the memory cell can be measured at bit line 341. A pass voltage $V_{pass}$ can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states, logic {1 and 0}, i.e., states ER and S1. In the MLC mode, a memory cell stores 2 bits, and has four logic states, logic {11, 10, 01, and 00}, i.e., states ER, M1, M2, and M3. In the TLC mode, a memory cell stores 3 bits, and has eight logic states, logic {111, 110, 101, 100, 011, 010, 001, 000}, i.e., states ER, and states T1-T7. In the QLC mode, a memory cell stores 4 bits and has 16 logic states, logic {1111, 1110, 1101, 1100, 1011, 1010, 1001, 1000, 0111, 0110, 0101, 0100, 0011, 0010, 0001, 0000}, i.e., states ER, and states Q1-Q15. Memory controller 20 of storage system 10 (see FIG. 1) can convert data received from host computer 15 into corresponding logic states of the memory cells on memory dies 100 and vice versa.

Figure 6:
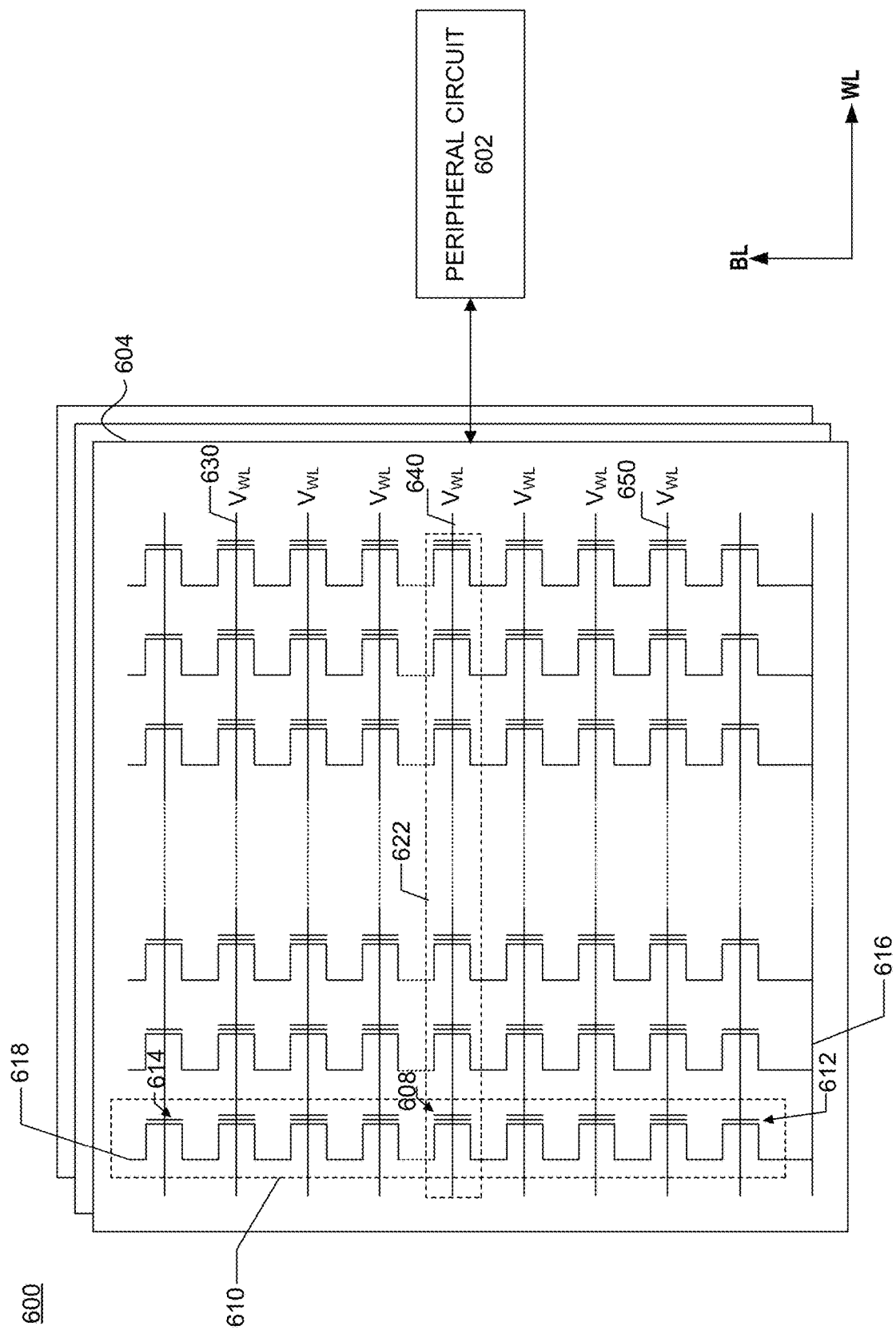
FIG. 6 illustrates an example schematic circuit diagram of a memory device, according to some embodiments.

FIG. 6 illustrates an example schematic circuit diagram 600 of a memory device, according to aspects of the present disclosure. The example schematic circuit diagram 600 includes a memory block 604 and a peripheral circuit 602. In some aspects, the example schematic circuit diagram 600 includes a plurality of memory strings 610, each memory string 610 having a plurality of memory cells 608. The memory string 610 also includes at least one field effect transistor (e.g., MOSFET) at each end, which is controlled by a lower select gate (LSG) 612 and a top select gate (TSG) 614, respectively. The memory cell 608 can be controlled by a control gate, where the control gate can be connected to a word line 640 of the example schematic circuit diagram 600. The drain terminal of the TSG 614 can be connected to the bit line 618, and the source terminal of the LSG 612 can be connected to an array common source (ACS) 616. The ACS 616 can be shared by the memory strings 610 in an entire memory block, and is also referred to as the common source line.

In some aspects, the example schematic circuit diagram 600 can be formed based on the floating gate technology. In some aspects, the example schematic circuit diagram 600 can be formed based on charge trapping technology. The NAND flash memory based on charge trapping can provide high storage density and high intrinsic reliability. Storage data or logic states (e.g., threshold voltage $V_{th}$ of the memory cell 608) depends on the amount of charge trapped in a storage layer. In some aspects, the memory block 604 can be a three-dimensional (3D) memory device, and the example schematic circuit diagram 600 can be a 3D memory array, where the memory cells 608 can be vertically stacked on top of each other.

In a NAND flash memory, read and write operations can be performed in a memory page 622, which includes all memory cells 608 sharing the same word line. In some aspects, a program voltage may be sent to the control gate of all memory cells 608 via a selected word line (e.g., WL 640) in the memory page 622 to program all memory cells 608 sharing the same word line. As described above with reference to FIG. 4, a row address X-ADDR and a column address Y-ADDR that can be used to locate the selected memory cell in the memory block 604. The row address X-ADDR of memory page 622 can be selected by a Row decoder/Word-Line Driver, such as Row decoder/Word-Line Driver 40 in FIG. 4. The row address can include a page index PD, a block index BD and a plane index PL to identify memory page 622, memory block 604, and memory plane 101 (in FIG. 3), respectively. The column address Y-ADDR can identify a byte or a word in the data of the memory page 622.

In some aspects, while one or more memory cells in memory page 622 receive the program voltage via a selected word line (e.g. WL 640), other, unselected memory cells may receive a pass voltage via one or more unselected word line (e.g., WL 630 and WL 650), which is high enough to provide the unselected memory cells in a conductive state but not high enough to program them.

In some aspects, the one or more memory cells may be programmed in a word line programming order, one word line at a time, starting at one end of a NAND string and continuing to the other end of the NAND string. In some aspects, the one or more memory cells may be programmed starting from WL with a low page index to WL with a high page index, one word line at a time. For example, the one or more memory cells may be programmed starting from WL 630 to WL 640 to WL 650, one word line at a time.

Due to different physical locations of different memory cells (e.g., different memory cells 608), the electrical performance can be different between different memory cells. Hence, the optimum voltage level and timing control of WL signals during programming operations can be different.

In a NAND memory, the memory cell 608 can be in an erase state ER or a programmed state P1. Initially, all memory cells 608 in the example schematic circuit diagram 600 can be reset to the erase state ER as logic "1" by implementing a negative voltage difference between control gates and source terminals of the memory cells (e.g., the array common source 616) such that all the trapped electronic charges in the storage layer of the memory cells 608 can be removed. For example, the negative voltage difference can be induced by setting the control gates of the memory cells 608 to ground, and applying a high positive voltage to the array common source 616. At the erase state ER ("state ER"), the threshold voltage $V_{th}$ of the memory cells 608 can be reset to the lowest value, and can be measured or sensed at the bit line 618.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 608, and thereby increase the threshold voltage $V_{th}$ of the memory cell 608. Thus the memory cell 608 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Figure 7:
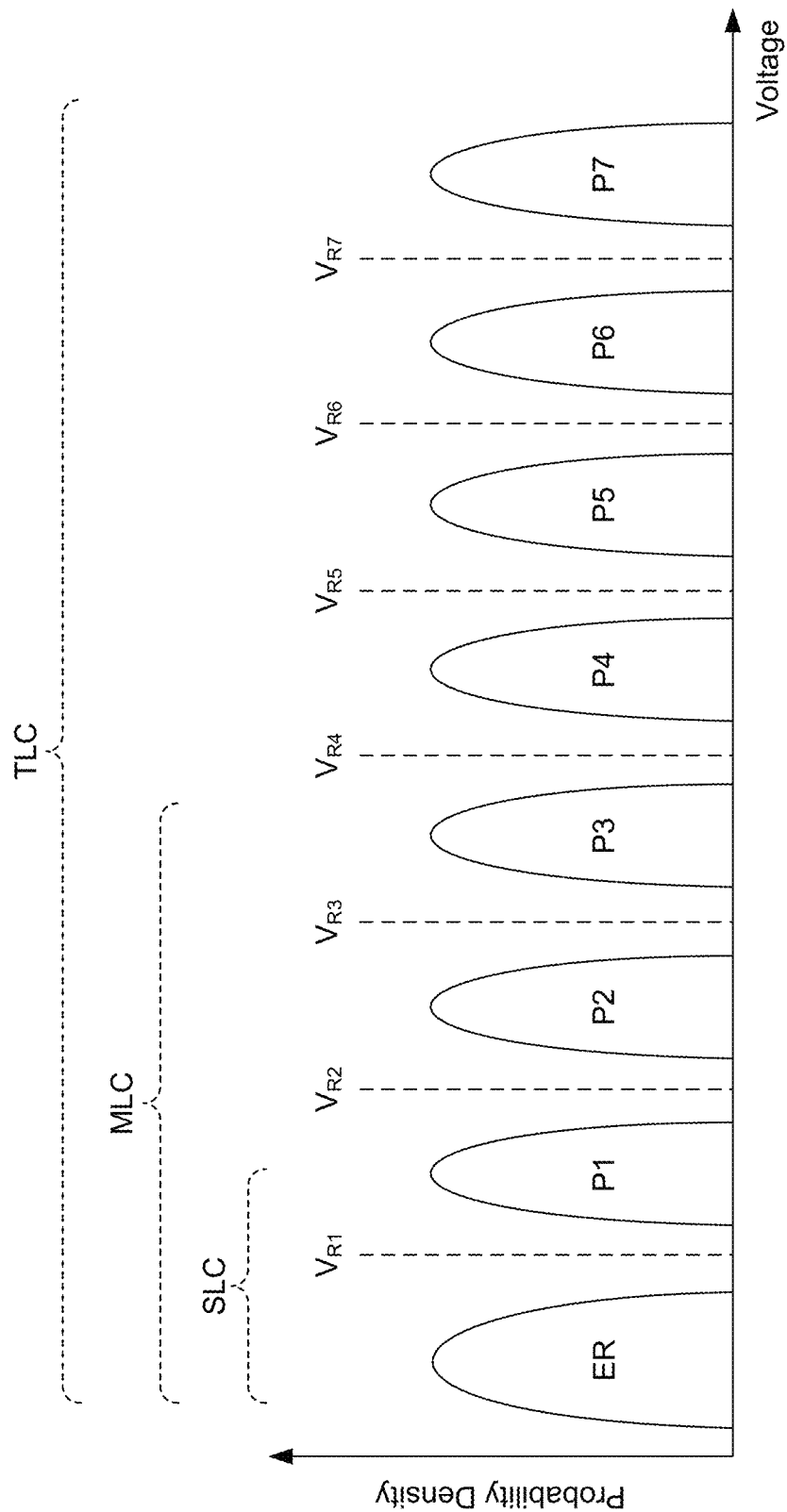
FIG. 7 illustrates a threshold voltage $V_{th}$ distribution of a NAND flash memory programmed in the SLC, MLC, or TLC modes, according to some embodiments.

FIG. 7 illustrates a threshold voltage $V_{th}$ distribution of a NAND flash memory programmed in the SLC, MLC, or TLC modes, according to some embodiments. In some embodiment of the SLC mode, state P1 corresponds to state S1. In some embodiment of the MLC mode, states P1-P3 corresponds to states M1-M3. In some embodiment of the TLC mode, states P1-P7 corresponds to states T1-T7. In some embodiments, each state of the memory cells can correspond to a specific range of threshold voltage $V_{th}$, where the threshold voltage $V_{th}$ distribution of each state can be represented by a probability density. In some embodiments, the states other than the erased state ER can be programmed by using an incremental step pulse programming (ISPP) scheme where the programming voltage $V_{pgm}$ can be incrementally increased by adding a step pulse $V_{step}$. For example, the eight TLC states can be programmed from state ER with a lower threshold voltage to state T7 with a highest threshold voltage.

In some embodiments, after programming, the eight TLC states ER and T1-T7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states T1-T7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

In some embodiments, as described above, to determine the two states ER and S1 stored in the SLC mode, it is sufficient to rely on just the read reference voltage $V_{R1}$. To determine the four states ER and M1-M3 in the MLC mode, the read reference voltages $V_{R1}$, $V_{R2}$ and $V_{R3}$ can be used. To determine the eight states ER and T1-T7 for the TLC mode, the read reference voltages $V_{R1}$-$V_{R7}$ can be used. For example, in the TLC mode, the threshold voltage of state ER is below $V_{R1}$, and the threshold voltage of state T7 is above $V_{R7}$, where the threshold voltages of state T1 is between $V_{R1}$ and $V_{R2}$. States T2-T6 can be determined similarly.

Figure 8A:
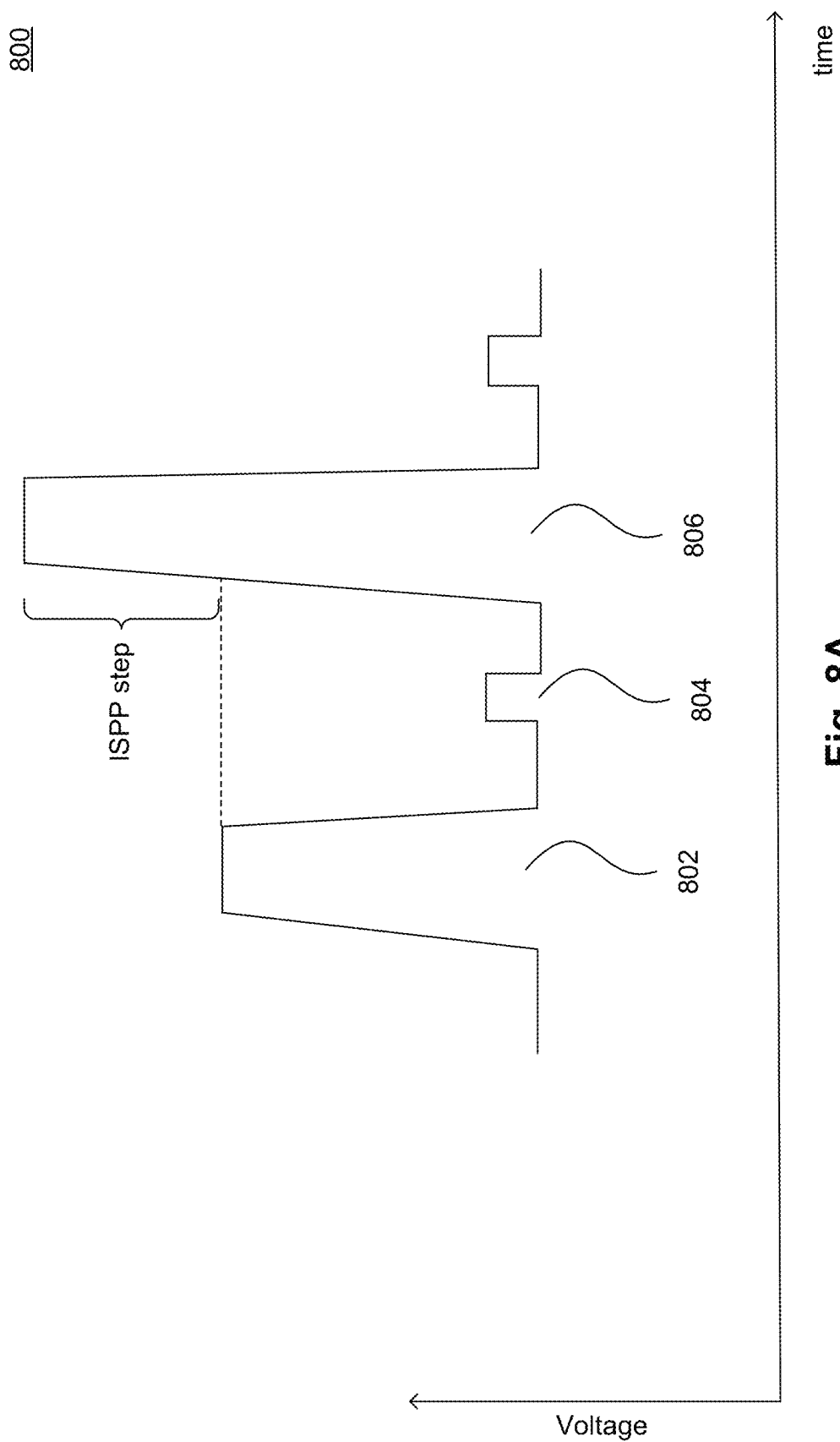
FIG. 8A illustrates an example method 800 of programming using an incremental step pulse programming (ISPP) scheme, according to some embodiments.

FIG. 8A illustrates an example method 800 of programming using an incremental step pulse programming (ISPP) scheme, according to some embodiments. FIG. 8A can be described with regard to elements of FIGS. 1-6. The example method 800 can be performed by a memory system (for example, the memory system 102 of FIG. 1). It should be appreciated that the example 800 is not exhaustive and that other operation steps can be performed as well before, after, or between any of the illustrated operation steps. In some embodiments, some operation steps of the example 800 can be omitted or other operation steps can be included, which are not described here for simplicity. In some embodiments, operation steps of the example 800 can be performed in a different order and/or vary.

In some aspects, during programming, the memory device can apply different programming voltages to memory cells to program the memory cells into different states. For example, as shown in FIG. 7, the memory cell may have a target state of the state P1. In such a case, the memory device can apply a programming voltage 802 to a WL associated with the memory cell to program the memory cell to the state P1. As shown in FIG. 7, a voltage range corresponds to the state P1 in the programming. Therefore, the memory device applies a reference voltage 804 to verify whether the threshold voltage of the memory cell satisfies the voltage range. If the threshold voltage of the memory cell satisfies the voltage range, the programming of the memory cell is complete. In some aspects, the memory device inhabits the memory cell for the programming. Thus, the memory device will not apply programming voltages to the memory cell in further programming. On the other hand, if the threshold voltage of the memory cell does not satisfy the voltage range, the memory device increases the programming voltage by a step pulse and applies the increased programming voltage to the WL associated with the memory cell. For example, the memory device increases the programming voltage 802 to a program voltage 806 by a step pulse, such as ISPP step. The memory device then applies the programming voltage 806 to the WL associated with the memory cell, after which the memory device verifies whether the threshold of the memory cell satisfies the voltage range. The memory device repeats the programming process until the threshold of the memory device satisfies the voltage range. The programming operations that apply the programming voltage in an incremental manner as discussed above are also referred to as ISPP.

Figure 8B:
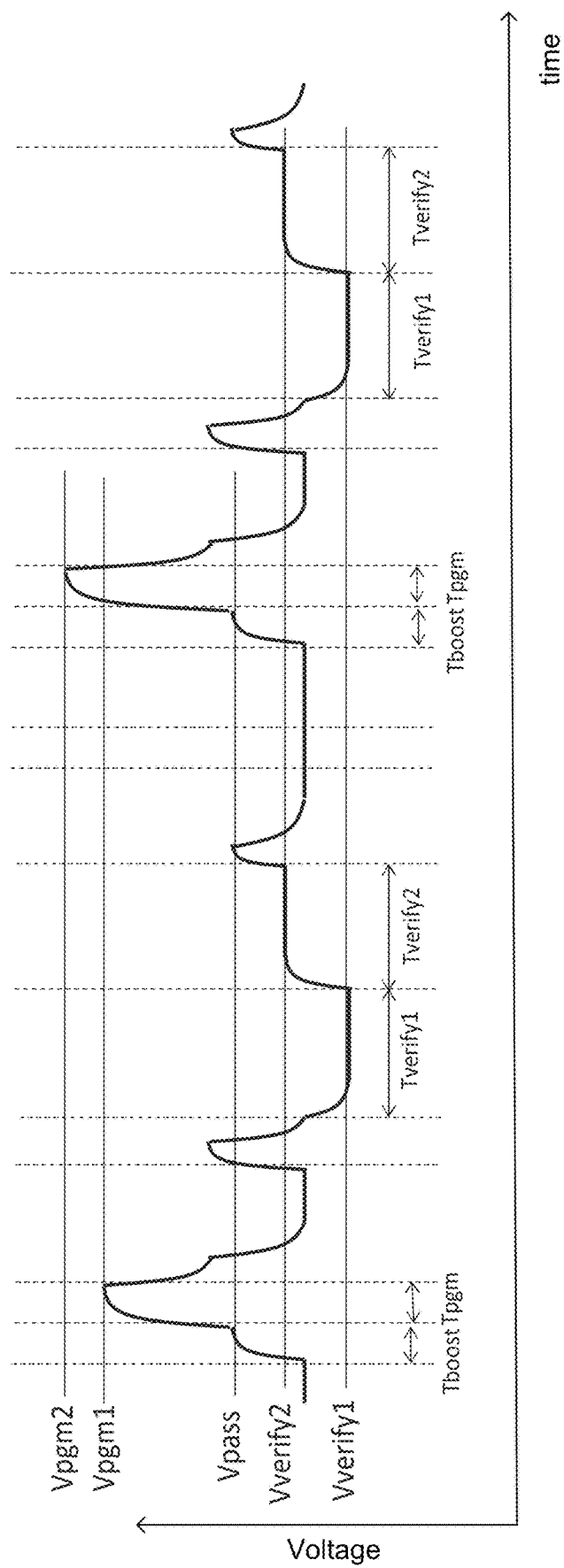
FIG. 8B illustrates an exemplary signal waveform during various phases of the programming using an ISPP scheme of FIG. 8A, according to some embodiments.

FIG. 8B illustrates an exemplary signal waveform during various phases of the programming using an ISPP scheme of FIG. 8A, according to some embodiments. Time is shown on the horizontal axis while signal amplitude is shown on the vertical axis. As described with reference to FIG. 8A, in some aspects, the memory device can apply one or more programming voltage signals including for example, voltages with magnitude of $V_{pgm1}$, $V_{pgm2}$ as shown in FIG. 8B to a selected WL during a programming operation to program a memory cell to a target state. In some aspects, the memory device can apply a set-up voltage, including for example, voltages with magnitude of $V_{pass}$ as shown in FIG. 8B during a programming operation to program a memory cell to a target state. In some aspects, the memory device can apply one or more reference voltages $V_{verify1}$, $V_{verify2}$ as shown in FIG. 8B to program a memory cell to a target state. One or more timings associated with the one or more voltages applied can include $T_{boost}$, $T_{pgm}$, $T_{verify1}$, $T_{verify2}$ as shown in FIG. 8B.

Due to different physical locations of the memory cells in a memory block, the electrical performance of one or more memory cells can be different, due to for example, process variations or design. Hence, the optimum voltage level control and/or timing control of one or more WL signals during programming operations can be different. In some aspects, one or more trim settings can be selected and applied to one or more WLs to optimize the voltage level control parameters (e.g., $V_{pgm1}$, $V_{pgm2}$, $V_{pass}$, $V_{verify1}$, $V_{verify2}$) and/or the timing control parameters (e.g., $T_{boost}$, $T_{pgm}$, $T_{verify1}$, $T_{verify2}$) to improve device performance.

Figure 9A:
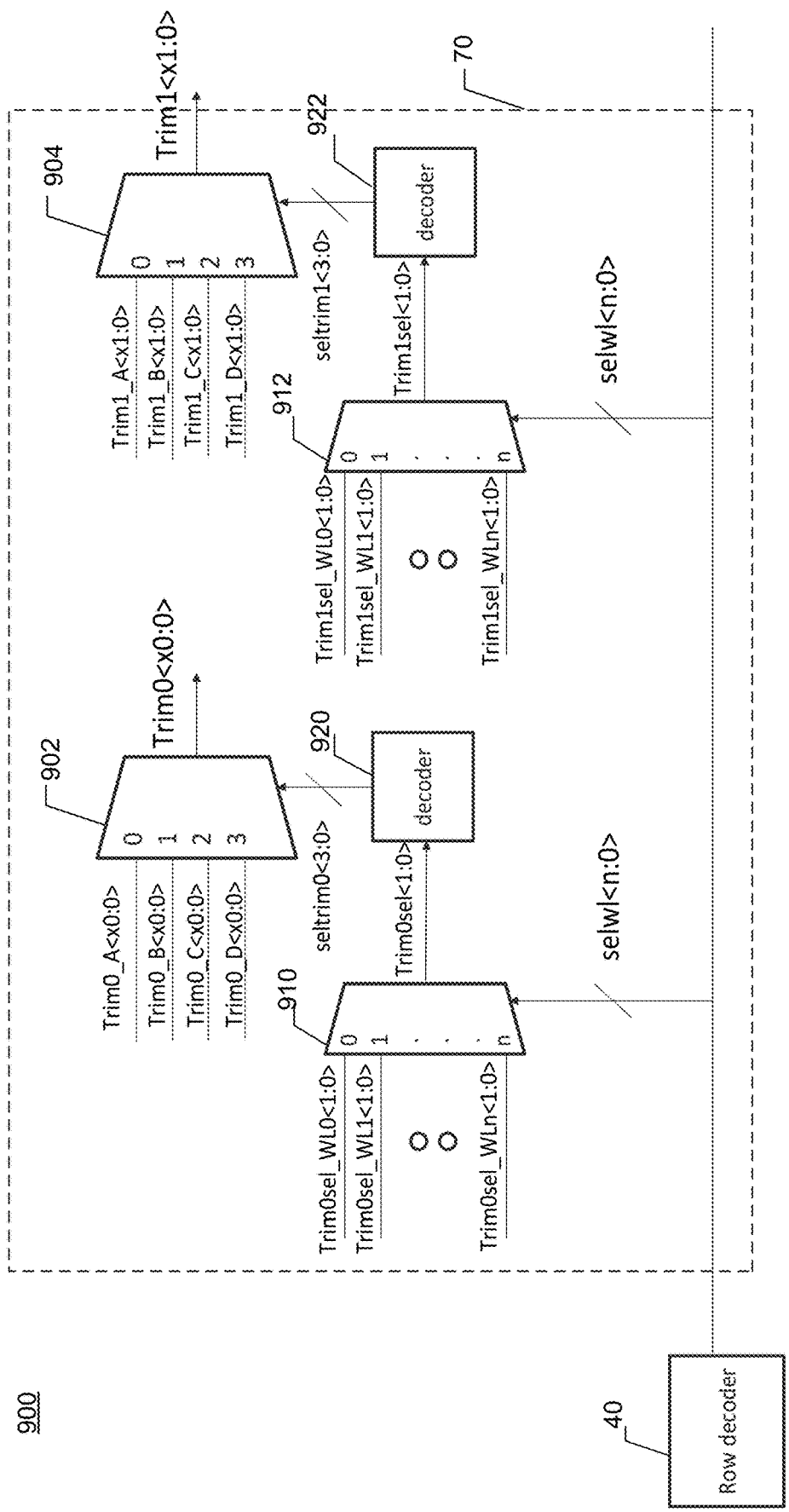
FIGS. 9A-9B illustrate example schematic diagrams of a memory device to perform trim settings selections, according to some embodiments.
Figure 9B:
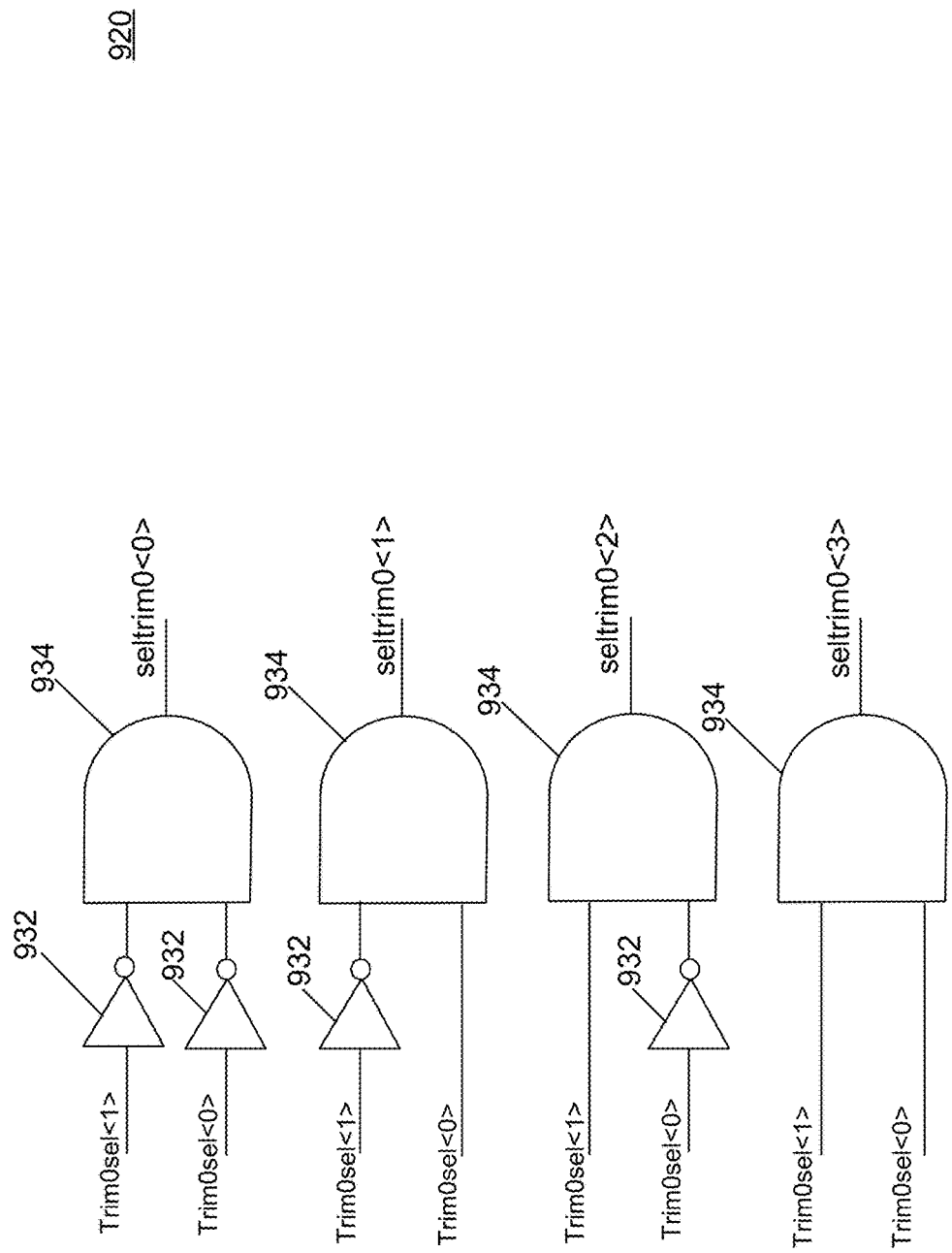

FIGS. 9A-9B illustrate example schematic diagrams of a memory device to perform trim settings selections, according to some embodiments. Not all of the depicted components may be used, however, and one or more implementations may include additional components not shown in the figure. Variations in the arrangement and types of the components may be made without departing from the spirit or scope of the claims as set forth herein. Additional, different or fewer components may be provided.

As illustrated in FIG. 9A, a schematic diagram 900 includes controller 70 and row decoder 40 as described with reference to FIG. 4. As described above with reference to FIG. 4, controller 70 can include one or more control circuits. In some aspects, controller 70 can include one or more registers, buffers, and/or memories to store one or more trim settings as described in the present disclosure. Row decoder/word line driver 40 can select one of the memory blocks 103 on the memory die 100 in response to an X-path control signal provided by the controller 70. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

As shown in FIG. 9A, controller 70 includes multiplexers (MUX) 902, 904, 910 and 912 and decoders 920 and 922. In some aspects, MUX 910 may be a first multiplexer, MUX 902 may be a second multiplexer, MUX 912 may be a third multiplexer and MUX 904 may be a fourth multiplexer.

In some aspects, row decoder/word line driver 40 can be configured to decode an address of a word line (e.g., WL 640) from the plurality of word lines in a memory block (e.g., memory block 604). In some aspects, the number of the plurality of word lines is N+1 and the WLs in the memory block can be represented as WL0, WL1, . . . WLn.

In some aspects, MUX 910 and 912 can include an N+1 to 1 MUX, including N+1 data input lines, a plurality of select lines and a single output. The plurality of select lines select one of the N+1 input lines to connect the output line. In some aspects, N+1 is number of WLs in a memory block. In some aspects, MUX 902 and 904 can include a 4-to-1 MUX including four data input lines, two select lines and a single output. The two select lines select one of the four input lines to connect the output line.

In some aspects, MUX 910 can be configured to receive a first plurality of trim selections as input signals. In some aspects, each of the first plurality of trim selections can be associated with a first trim parameter and each of the first plurality of trim selections can correspond to each of the plurality of word lines in a memory block (e.g., memory block 604), respectively. For example, as shown in FIG. 9A, the first plurality of trim selections can include input signals of Trim0sel_WL0<1:0>, Trim0sel_WL1<1:0>, . . . , and Trim0sel_WLn<1:0>. In some aspects, the first trim parameter can include a voltage level control trim parameter to perform a programming operation on the word line. In some aspects, the first trim parameter can include a timing control trim parameter to perform a programming operation on the word line. In some aspects, MUX 910 can be configured to select a first trim selection corresponding to the word line from the first plurality of trim selections based on an output of row decoder/word line driver 40. For example, MUX 910 can be configured to select a first trim selection Trim0sel_WL640<1:0> corresponding to the WL 640 based on an output of row decoder/word line driver 40. In some aspects, Trim0 can be associated with the first trim parameter. In some aspects, the first trim selection Trim0sel_WL640<1:0> can be associated with selecting a trim setting for a voltage level control trim parameter (e.g., Vpgm) associated with WL 640. In some aspects, MUX 910 can be configured to output the first trim selection to a first trim selection decoder 920.

In some aspects, MUX 902 can be configured to receive a first plurality of trim settings as inputs. In some aspects, while MUX 902 can be configured to have four inputs, such as Trim0_A<x0:0>, Trim0_B<x0:0>, Trim0_C<x0:0>, Trim0_D<x0:0>. In some aspects, MUX 902 can be configured to have inputs of any number, such as 2, 8, 16, 32 or more. In some aspects, x0+1 is the bit number of each of the inputs. In some aspects, each of the first plurality of trim settings can correspond to a value associated with the first trim parameter. In some aspects, the first trim setting can include a programming signal magnitude, a read reference signal magnitude, or a pass signal magnitude to perform a programming operation on the word line. In some aspects, the first trim setting can include a programming signal length, or a read reference signal length to perform a programming operation on the word line.

In some aspects, MUX 902 can be configured to select a first trim setting from the first plurality of trim settings based on an output of the first trim selection decoder. In some aspects, the first trim setting can be associated with the first trim parameter and correspond to the word line. In some aspects, the number of the first plurality of trim settings can include, but not limited to four. In some aspects, the first plurality of trim settings can include four different programming signal magnitudes and the first trim setting can include one of the four different programming signal magnitudes. In some aspects, MUX 902 can be configured to output the first trim setting to row decoder 40. In some aspects, controller 70 can be configured to control row decoder 40 to apply the first trim setting to the word line for performing a programming operation on the word line.

In some aspects, MUX 912 can be configured to receive a second plurality of trim selections as input signals. In some aspects, each of the second plurality of trim selections can be associated with a second trim parameter and each of the second plurality of trim selections can correspond to each of the plurality of word lines in a memory block (e.g., memory block 604), respectively. For example, as shown in FIG. 9A, the second plurality of trim selections can include input signals of Trim1sel_WL0<1:0>, Trim1sel_WL1<1:0>, ..., and Trim1sel_WLn<1:0>. In some aspects, the second trim parameter can include a voltage level control trim parameter to perform a programming operation on the word line. In some aspects, the second trim parameter can include a timing control trim parameter to perform a programming operation on the word line. In some aspects, MUX 912 can be configured to select a second trim selection corresponding to the word line from the second plurality of trim selections based on an output of the row decoder. For example, MUX 912 can be configured to select a second trim selection Trim1sel_WL640<1:0> corresponding to the WL 640 based on an output of the row decoder 40. In some aspects, Trim1 can be associated with the second trim parameter. In some aspects, the second trim selection Trim1sel_WL640<1:0> can be associated with selecting a trim setting for a timing control trim parameter (e.g., Tpgm) associated with WL 640. In some aspects, MUX 912 can be configured to output the second trim selection to a second trim selection decoder 922.

In some aspects, MUX 904 can be configured to receive a second plurality of trim settings as inputs. In some aspects, while MUX 904 can be configured to have 4 inputs, such as Trim1_A<x1:0>, Trim1_B<x1:0>, Trim1_C<x1:0>, Trim1_D<x1:0>. In some aspects, MUX 904 can be configured to have inputs of any number, such as 2, 8, 16, 32 or more. In some aspects, x1+1 is the bit number of each of the inputs. In some aspects, each of the second plurality of trim settings can correspond to a value associated with the second trim parameter. In some aspects, the second trim setting can include a programming signal magnitude, a read reference signal magnitude, or a pass signal magnitude to perform a programming operation on the word line. In some aspects, the second trim setting can include a programming signal length, or a read reference signal length to perform a programming operation on the word line.

In some aspects, MUX 904 can be configured to select a second trim setting from the second plurality of trim settings based on an output of the second trim selection decoder. In some aspects, the second trim setting can be associated with the second trim parameter and correspond to the word line.

In some aspects, the number of the second plurality of trim settings can include, but not limited to four. In some aspects, the second plurality of trim settings can include four different programming signal lengths and the second trim setting can include one of the four different programming signal lengths. In some aspects, MUX 904 can be configured to output the second trim setting to row decoder 40. In some aspects, controller 70 can be configured to control row decoder 40 to apply the second trim setting to the word line for performing a programming operation on the word line. In some aspects, the second trim parameter is different from the first trim parameter.

In some aspects, an example schematic diagram of decoders 920 is shown in FIG. 9B. Decoders 920 can include inverter logic gates 932 and one or more AND logic gates 934. Decoders 920 can include 2 bits of inputs of Trim0sel<1:0>, and 4 bit of outputs of seltrim0<3:0>.

In some aspects, the example schematic diagram of decoders 920 can include an example schematic diagram decoder 922. Decoders 922 can include inverter logic gates 932 and one or more AND logic gates 934. Decoders 922 can include 2 bits of inputs of Trim1sel<1:0>, and 4 bit of outputs of seltrim1<3:0>.

As shown in Table 1, one or more trim settings can be selected and applied to corresponding WLs by using the example schematic diagrams of a memory device to perform trim settings selections as described with reference to FIG. 9A-B.

TABLE 1

Trim settings table

| WL/Row Number | Trim0 | Trim1 | Trim2 | ...... | TrimM |
|---|---|---|---|---|---|
| WL0 | Trim0_A | Trim1_B | Trim2_D | | TrimM_C |
| WL1 | Trim0_C | Trim1_A | Trim2_C | | TrimM_B |
| ... | | | | | |
| .. | | | | | |
| .. | | | | | |
| ... | | | | | |
| WLn-1 | Trim0_C | Trim1_D | Trim2_A | | TrimM_D |
| WLn | Trim0_D | Trim1_A | Trim2_B | | TrimM_A |

In some aspects, each of Trim0, Trim1, Trim2, ..., TrimM can include a trim parameter including a voltage level control trim parameter or a timing control trim parameter to perform a programming operation on the word line. For example, Trim0 can include the first trim parameter (e.g., a voltage control trim parameter) and Trim1 can include a second trim parameter (e.g., a timing control trim parameter).

Each of the trim parameter Trim0, Trim1, Trim2, TrimM can include four different trim settings. For example, the first trim parameter Trim0 can include four trim settings Trim0_A, Trim0_B, Trim0_C, and Trim0_D as four different voltage levels. As another example, the second trim parameter Trim1 can include four trim settings Trim1_A, Trim1_B, Trim1_C, and Trim1_D as four different time lengths.

Currently, a global trim method may be used, which the same value of a trim parameter may be applied for all WLs in a memory block. The same value of the trim parameter may be selected to optimize the WL with the worst performance. The global trim method may cause performance degradation and lower power efficiency. Alternatively or in addition, an individual WL trim method may be used to improve trim control flexibility. A different value of a trim parameter may be applied for each individual WL in a memory block. A large size of trim parameter bits and selection circuits may be required.

In the present disclosure, four different trim settings can be included for each trim parameter. An advantage with the present disclosure can be more significant in case of a large number of WLs, a large number of trim parameters (e.g., voltage/timing trim parameter control) for each WL, and the larger trim size for each voltage and trimming trim parameters.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way. The breadth and scope of the present disclosure should not be limited by any of the above-described exemplary embodiments, but should be defined only in accordance with the following claims and their equivalents.

What is claimed is:

1. A three-dimensional (3D) NAND memory device, comprising:
    memory cells coupled to a plurality of word lines, wherein the memory cells are configured to store data;
    a row decoder configured to decode an address of a word line from the plurality of word lines; and
    a controller, wherein the controller is coupled to an array of memory cells and includes:
    a first multiplexer configured to:
    receive a first plurality of trim selections, wherein each of the first plurality of trim selections is associated with a first trim parameter and each of the first plurality of trim selections corresponds to each of the plurality of word lines, respectively;
    select a first trim selection corresponding to the word line from the first plurality of trim selections; and
    output the first trim selection to a first trim selection decoder; and
    a second multiplexer configured to:
    receive a first plurality of trim settings, wherein each of the first plurality of trim settings corresponds to a value associated with the first trim parameter;
    select a first trim setting from the first plurality of trim settings based on an output of the first trim selection decoder, wherein the first trim setting is associated with the first trim parameter and corresponds to the word line; and
    output the first trim setting to the row decoder.

2. The memory device of claim 1, wherein the first trim parameter comprises a voltage level control trim parameter or a timing control trim parameter to perform a programming operation on the word line.

3. The memory device of claim 1, wherein the first trim setting comprises a programming signal magnitude, a read reference signal magnitude, or a pass signal magnitude to perform a programming operation on the word line.

4. The memory device of claim 1, wherein the first trim setting comprises a programming signal length, or a read reference signal length to perform a programming operation on the word line.

5. The memory device of claim 1, wherein the number of the first plurality of trim settings is four.

6. The memory device of claim 1, wherein the controller is configured to control the row decoder to apply the first trim setting to the word line for performing a programming operation on the word line.

7. The memory device of claim 1, wherein the controller further comprises:
    a third multiplexer configured to:
    receive a second plurality of trim selections, wherein each of the second plurality of trim selections is associated with a second trim parameter and each of the second plurality of trim selections corresponds to each of the plurality of word lines, respectively;
    select a second trim selection corresponding to the word line from the second plurality of trim selections; and
    output the second trim selection to a second trim selection decoder; and
    a fourth multiplexer configured to:
    receive a second plurality of trim settings, wherein each of the second plurality of trim settings corresponds to a value associated with the second trim parameter;
    select a second trim setting from the second plurality of trim settings based on an output of the second trim selection decoder, wherein the second trim setting is associated with the second trim parameter and corresponds to the word line; and
    output the second trim setting to the row decoder.

8. The memory device of claim 7, wherein the second trim parameter comprises a voltage level control trim parameter or a timing control trim parameter to perform a programming operation on the word line.

9. The memory device of claim 7, wherein the number of the second plurality of trim settings is four.

10. The memory device of claim 7, wherein the controller is configured to control the row decoder to apply the second trim setting to the word line to perform a programming operation on the word line.

11. The memory device of claim 7, wherein the second trim parameter is different from the first trim parameter.

12. A method for operating a memory device, comprising:
    receiving a first plurality of trim selections;
    selecting a first trim selection corresponding to a word line from the first plurality of trim selections;
    outputting the first trim selection to a first trim selection decoder;
    receiving a first plurality of trim settings, wherein each of the first plurality of trim settings corresponds to a value associated with a first trim parameter;
    selecting a first trim setting from the first plurality of trim settings based on an output of the first trim selection decoder, wherein the first trim setting is associated with the first trim parameter and corresponds to the word line; and outputting the first trim setting.

13. The method of claim 12, wherein the first trim parameter comprises a voltage level control trim parameter or a timing control trim parameter to perform a programming operation on the word line.

14. The method of claim 12, wherein the first trim setting comprises a programming signal magnitude, a read reference signal magnitude, or a pass signal magnitude to perform a programming operation on the word line.

15. The method of claim 12, wherein the first trim setting comprises a programming signal length, or a read reference signal length to perform a programming operation on the word line.

16. The method of claim 12, wherein the number of the first plurality of trim settings is four.

17. The method of claim 12, further comprising applying the first trim setting to the word line for performing a programming operation on the word line.

18. The method of claim 12, further comprising:
receiving a second plurality of trim selections;
selecting a second trim selection corresponding to the word line from the second plurality of trim selections;
outputting the second trim selection to a second trim selection decoder;
receiving a second plurality of trim settings, wherein each of the second plurality of trim settings corresponds to a value associated with a second trim parameter;
selecting a second trim setting from the second plurality of trim settings based on an output of the second trim selection decoder, wherein the second trim setting is associated with the second trim parameter and corresponds to the word line; and
outputting the second trim setting.

19. The method of claim 18, wherein the second trim parameter is different from the first trim parameter.

20. A memory system, comprising:
a memory array comprising memory cells coupled to a plurality of word lines, wherein the memory cells are configured to store data;
a row decoder configured to decode an address of a word line from the plurality of word lines; and
a controller, wherein the controller is coupled to an array of memory cells and includes:
a first multiplexer configured to:
receive a first plurality of trim selections, wherein each of the first plurality of trim selections is associated with a first trim parameter and each of the first plurality of trim selections corresponds to each of the plurality of word lines, respectively;
select a first trim selection corresponding to the word line from the first plurality of trim selections; and
output the first trim selection to a first trim selection decoder; and
a second multiplexer configured to:
receive a first plurality of trim settings, wherein each of the first plurality of trim settings corresponds to a value associated with the first trim parameter;
select a first trim setting from the first plurality of trim settings based on an output of the first trim selection decoder, wherein the first trim setting is associated with the first trim parameter and corresponds to the word line; and
output the first trim setting to the row decoder.

* * * * *